US011349076B2

(12) United States Patent
Cheng

(10) Patent No.: US 11,349,076 B2
(45) Date of Patent: May 31, 2022

(54) DISPLAY PANEL, EVAPORATION METHOD OF LUMINOUS MATERIAL AND EQUIPMENT

(71) Applicant: Wuhan China Star Optoelectronics Technology Co., Ltd., Wuhan (CN)

(72) Inventor: Wei Cheng, Wuhan (CN)

(73) Assignee: Wuhan China Star Optoelectronics Technology Co., Ltd., Wuhan (CN)

(*) Notice: Subject to any disclaimer, the term of this patent is extended or adjusted under 35 U.S.C. 154(b) by 370 days.

(21) Appl. No.: 16/349,611

(22) PCT Filed: Mar. 5, 2019

(86) PCT No.: PCT/CN2019/076912
§ 371 (c)(1),
(2) Date: May 14, 2019

(87) PCT Pub. No.: WO2020/077935
PCT Pub. Date: Apr. 23, 2020

(65) Prior Publication Data
US 2020/0287139 A1 Sep. 10, 2020

(30) Foreign Application Priority Data
Oct. 17, 2018 (CN) .......................... 201811207832.5

(51) Int. Cl.
H01L 51/00 (2006.01)
H01L 51/56 (2006.01)
(Continued)

(52) U.S. Cl.
CPC ........ H01L 51/0011 (2013.01); C23C 14/042 (2013.01); C23C 14/048 (2013.01);
(Continued)

(58) Field of Classification Search
CPC ............. H01L 21/001; H01L 21/02269; H01L 21/02631; H01L 21/2855; H01L 51/001;
(Continued)

(56) References Cited

U.S. PATENT DOCUMENTS 5,784,141 A * 7/1998 Chen ................. G02F 1/133753
349/163
6,220,914 B1 * 4/2001 Lee ........................ B82Y 40/00
445/24
(Continued)

FOREIGN PATENT DOCUMENTS

CN 1227714 11/2005
CN 104241551 12/2014
(Continued)

Primary Examiner — Maliheh Malek

(57) ABSTRACT

A display panel, an evaporation method of a luminous material, and an equipment are provided. The method is performed by providing an electric field covering an array substrate, and generating luminous material charged particles. After the luminous material charged particles passing through the mask, they will change a direction of motion under an action of the electric field, and move perpendicularly to a pixel area of the array substrate along a direction of the electric field, and then uniformly deposit on the pixel area of the array substrate, which ensures that a uniformity of film formation of the luminous material.

16 Claims, 4 Drawing Sheets

(51) Int. Cl.
  *C23C 14/04* (2006.01)
  *H01L 51/50* (2006.01)
  *H01L 21/02* (2006.01)
  *C23C 14/32* (2006.01)
  *H01L 27/32* (2006.01)
  *H01L 21/285* (2006.01)

(52) U.S. Cl.
  CPC ........ *C23C 14/32* (2013.01); *H01L 21/02269* (2013.01); *H01L 27/3246* (2013.01); *H01L 51/001* (2013.01); *H01L 51/56* (2013.01); *H01L 21/02631* (2013.01); *H01L 21/2855* (2013.01); *H01L 51/5012* (2013.01)

(58) Field of Classification Search
  CPC . H01L 51/0011; H01L 51/5012; H01L 51/56; C23C 14/0021–0031; C23C 14/228; C23C 14/24–325
  See application file for complete search history.

(56) References Cited

U.S. PATENT DOCUMENTS

| | | | |
|---|---|---|---|
| 6,255,775 B1* | 7/2001 | Ikuko | H01L 27/3211 313/506 |
| 8,623,696 B2* | 1/2014 | Cho | H01L 51/0005 438/99 |
| 10,217,939 B1* | 2/2019 | Yu | H01L 51/0096 |
| 10,541,386 B2* | 1/2020 | Yi | C23C 14/243 |
| 2002/0197393 A1 | 12/2002 | Kuwabara | |
| 2004/0219859 A1 | 11/2004 | Yamazaki et al. | |
| 2006/0197080 A1 | 9/2006 | Yamazaki et al. | |
| 2007/0241267 A1* | 10/2007 | Gruev | G01J 4/04 250/225 |
| 2009/0269509 A1* | 10/2009 | Yokoyama | C23C 14/12 427/554 |
| 2011/0146579 A1* | 6/2011 | Seo | C23C 14/243 118/726 |
| 2014/0011312 A1* | 1/2014 | Roh | C23C 14/12 438/46 |
| 2014/0252504 A1* | 9/2014 | Chuang | H01L 29/7834 257/412 |
| 2015/0041793 A1* | 2/2015 | Chan | H01L 51/56 257/40 |
| 2015/0293440 A1* | 10/2015 | Kim | G03F 1/38 430/5 |
| 2016/0056378 A1 | 2/2016 | Zhang | |
| 2016/0148970 A1* | 5/2016 | Cheng | H01L 27/14685 257/292 |
| 2017/0069842 A1* | 3/2017 | Hamamoto | B05B 5/0533 |
| 2017/0255073 A1* | 9/2017 | Wang | G02F 1/1368 |
| 2018/0013063 A1 | 1/2018 | Hamamoto et al. | |
| 2018/0114775 A1* | 4/2018 | Ray | H01L 25/0655 |
| 2018/0315924 A1* | 11/2018 | Anan | H01L 51/0011 |
| 2018/0342371 A1* | 11/2018 | Isaji | H01J 37/304 |
| 2019/0051827 A1* | 2/2019 | Yu | H01L 51/5237 |
| 2020/0123651 A1* | 4/2020 | Kim | C23C 14/042 |
| 2020/0266332 A1* | 8/2020 | Ting | H01L 41/257 |
| 2021/0072577 A1* | 3/2021 | Wang | G02F 1/136209 |
| 2021/0327947 A1* | 10/2021 | Lin | H01L 27/14643 |
| 2021/0328003 A1* | 10/2021 | Liu | H01L 27/3258 |
| 2021/0336187 A1* | 10/2021 | Tang | H01L 51/5228 |

FOREIGN PATENT DOCUMENTS

| | | |
|---|---|---|
| CN | 108300962 | 7/2018 |
| CN | 109411603 | 3/2019 |
| TW | 484238 | 4/2002 |

* cited by examiner

DISPLAY PANEL, EVAPORATION METHOD OF LUMINOUS MATERIAL AND EQUIPMENT

RELATED APPLICATIONS

This application is a National Phase of PCT Patent Application No. PCT/CN2019/076912 having International filing date of Mar. 5, 2019, which claims the benefit of priority of Chinese Patent Application No. 201811207832.5 filed on Oct. 17, 2018. The contents of the above applications are all incorporated by reference as if fully set forth herein in their entirety.

FIELD AND BACKGROUND OF THE INVENTION

The present disclosure relates to the field of displays, and in particular to a display panel, an evaporation method of a luminous material, and an equipment.

In manufacture of OLED display panels, in general, an array substrate is firstly fabricated, and then a luminous material is evaporated to a pixel area of the array substrate by an evaporation process.

FIG. 1 shows an evaporation process in the prior art. A mask is aligned with an array substrate, and then an evaporation source evaporates a luminous material. However, at a critical position of red (R), green (G), and blue (B) sub-pixels, the luminescent material will restricted by a shadow of the mask. If a uniformity of film formation of the electroluminescent (EL) material is poor, there is a color shift or color mixing problem at the critical position of the sub-pixels.

That is, an existing display panel has a technical problem that the uniformity of a film of the luminous material is poor at the critical position of the sub-pixels.

SUMMARY OF THE INVENTION

The present disclosure provides a display panel, an evaporation method of a luminous material and an equipment, so as to solve the technical problem of a poor uniformity of film formation of the luminous material at a critical position of sub-pixels in an existing display panel.

In order to solve the above problems, the technical solution provided by the present disclosure is as follows.

The present disclosure provides an evaporation method for a luminous material, including:

aligning a mask with an array substrate;

generating an electric field covering the array substrate; and processing the luminous material to generate luminous material charged particles, where after the luminous material charged particles pass through the mask, they are deposited on a pixel area of the array substrate under the electric field.

In the evaporation method for the luminous material of the present disclosure, in the step of generating the electric field covering the array substrate, the method includes:

grounding the mask; and supplying power to an electric-field electrode, where the electric-field electrode is parallel to the mask, and the array substrate is located between the electric-field electrode and the mask.

In the evaporation method for the luminous material of the present disclosure, in the step of generating the luminous material charged particles, the method includes:

outputting luminous material particles by a luminous material evaporation source; and controlling electric charges of the luminous material particles having a specific polarity.

In the evaporation method for the luminous material of the present disclosure, the method further includes: supplying power to a circuit of the array substrate.

In the evaporation method for the luminous material of the present disclosure, in the step of supplying power to the circuit of the array substrate, the method includes: supplying power to the circuit of the array substrate by a thin film transistor circuit of the array substrate.

In the evaporation method for the luminous material of the present disclosure, the method further includes: disposing a conducting post on a surface of a pixel definition layer of the array substrate.

In the evaporation method for the luminous material of the present disclosure, the method further includes: supplying power to the conducting post disposed on the surface of the pixel definition layer of the array substrate.

In the evaporation method for the luminous material of the present disclosure, in the step of supplying power to the conducting post disposed on the surface of the pixel definition layer of the array substrate, the method includes: electrically connecting the conducting post to a conductive terminal of an evaporation equipment, and supplying power to the conducting post by the conductive terminal of the evaporation equipment.

The present disclosure provides a display panel, including: an array substrate, a pixel definition layer disposed on the array substrate, and a luminous material layer in a pixel area defined by the pixel definition layer, where the luminous material layer is formed by the evaporation method of the luminous material provided by the present disclosure.

In the display panel of the present disclosure, the display panel further includes a plurality of conducting posts disposed on a surface of the pixel definition layer of the array substrate.

In the display panel of the present disclosure, the plurality of conducting posts are continuously arranged to form a supporting wall.

In the display panel of the present disclosure, the display panel further includes an encapsulation layer disposed on the pixel definition layer and the luminous material layer.

In the display panel of the present disclosure, the encapsulation layer includes a first inorganic layer, a second inorganic layer, and an organic layer disposed between the first inorganic layer and the second inorganic layer.

The present disclosure also provides an evaporation equipment for a luminous material, including:

an alignment module configured to align a mask with an array substrate;

an electric field module configured to generate an electric field covering the array substrate; and a charged ion module configured to process the luminous material to generate luminous material charged particles, where after the luminous material charged particles pass through the mask, they are deposited on a pixel area of the array substrate under the electric field.

In the evaporation equipment for the luminous material of the present disclosure, the evaporation equipment further includes an electric-field electrode, where the electric-field electrode is parallel to the mask.

In the evaporation equipment for the luminous material of the present disclosure, the evaporation equipment further includes a first power supply module configured to supply power to a circuit of the array substrate.

In the evaporation equipment for the luminous material of the present disclosure, the evaporation equipment further includes a second power supply module configured to supply power to a conducting post disposed on a surface of a pixel definition layer of the array substrate.

In the evaporation equipment for the luminous material of the present disclosure, the charged ion module includes an evaporation source and a charge source, and the evaporation source is configured to control a luminous material evaporation source to output luminous material particles, and the charge source is configured to control electric charges of the luminous material particles having a specific polarity.

In the evaporation equipment for the luminous material of the present disclosure, the charge source includes a mesh charging structure.

In the evaporation equipment for the luminous material of the present disclosure, the electric field module includes a ground terminal and an electric field power terminal, and the electric field power terminal is configured to output an electric field voltage, and in operation, the mask is grounded through the ground terminal, and the electric-field electrode obtains an electric field voltage through the electric field power terminal to form the electric field.

Advantages of the present disclosure are as follows. The present disclosure provides a new evaporation technique for a luminous material, including aligning a mask with an array substrate; generating an electric field covering the array substrate; and processing the luminous material to generate luminous material charged particles, where after the luminous material charged particles pass through the mask, they are deposited on a pixel area of the array substrate under the electric field. By providing the electric field covering the array substrate and generating the luminous material charged particles, these luminous material charged particles will change a direction of motion under an action of the electric field after passing through the mask. The luminous material charged particles are vertically moved toward a pixel area of the array substrate along a direction of the electric field, and then uniformly deposited on the pixel area of the array substrate, and are not deposited in a pixel critical position along an original moving direction, nor deposited in other positions. A The uniformity of film formation of the luminous material is ensured, and the technical problem of a poor uniformity of film formation of the luminous material at the critical position of sub-pixels existing in the existing display panel is solved, and a color shift or color mixing problem at the critical position of the sub-pixels is also solved.

BRIEF DESCRIPTION OF THE SEVERAL VIEW OF THE DRAWINGS

In order to illustrate the technical proposal of implementations of the embodiments of the present disclosure or existing technology clearly, With reference to the accompanying drawings, the description of the implementations of the present disclosure or existing technology are given as following briefly. Obviously, the given accompanying drawings are only implementations of the present disclosure, so that, those of ordinary skill in the art could get other accompanying drawings in accordance with the accompanying drawings without devoting a creative effort.

DESCRIPTION OF SPECIFIC EMBODIMENTS OF THE INVENTION

Figure 1:
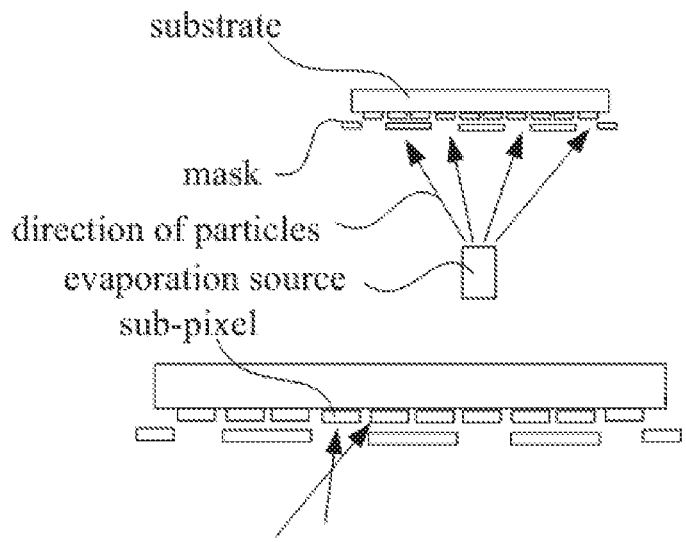
FIG. 1 is a schematic diagram of an evaporation process in the prior art.

The foregoing objects, features and advantages adopted by the present disclosure can be best understood by referring to the following detailed description of the preferred embodiments and the accompanying drawings. Furthermore, directional terms described in the present disclosure, such as upper, lower, front, rear, left, right, inner, outer, side and etc., are only directions referring to the accompanying drawings, so that the used directional terms are used to describe and understand the present disclosure, but the present disclosure is not limited thereto. In the drawings, similar structural units are designated by the same reference numerals.

The present disclosure can solve shortcomings of the technical problem of a poor uniformity of film formation of the luminous material at a critical position of sub-pixels in an existing display panel.

Figure 2:
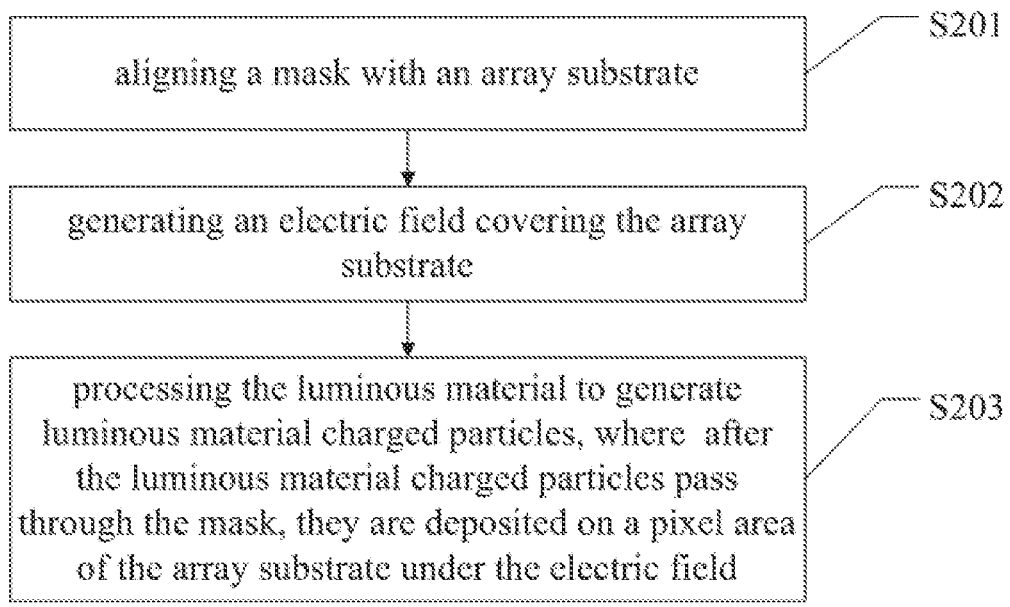
FIG. 2 is a first flowchart of an evaporation method according to an embodiment of present disclosure.

In one embodiment, as shown in FIG. 2, an evaporation method of a luminous material provided by the embodiment of the present disclosure includes the following steps.

In a step S201, a mask is aligned with an array substrate.

In a step S202, an electric field covering the array substrate is generated.

In a step S203, the luminous material is processed to generate luminous material charged particles. After the luminous material charged particles pass through the mask, they are deposited on a pixel area of the array substrate under the electric field.

In an embodiment, the step S202 includes: grounding the mask and supplying power to the electric-field electrode. The electric-field electrode is parallel to the mask, and the array substrate is located between the electric-field electrode and the mask. For example, the mask is grounded and serves as another electrode for the electric field. The electric-field electrode is disposed under a thin film transistor (TFT) substrate. A vertical electric field is formed between the mask and the TFT substrate, so that charged particles of an electroluminescent (EL) material are evaporated to a surface of the TFT substrate in a vertical direction.

In an embodiment, the step S203 includes: outputting luminous material particles by a luminous material evaporation source, and controlling electric charges of the luminous material particles having a specific polarity. For example, when the EL material is heated in the evaporation equipment, the evaporation source takes place in a form of electron flux.

Since a large number of charged particles accumulate on the surface of the substrate, particles of the same polarity tend to repel each other. When accumulating excessive electric charges, it is easy to cause electrostatic damage. Therefore, current is fed to a TFT circuit during the evaporation process, and the charged particles reach the surface of the substrate and are electrically neutral. In one embodiment, before the step S203 of the method shown in FIG. 2, the method further includes: supplying power to a circuit of the array substrate to neutralize the electric charges of the luminous material charged particles deposited at the position of the pixels.

In an embodiment, the step of supplying power to the circuit of the array substrate includes: supplying power to a circuit of the array substrate by a thin film transistor (TFT) circuit of an array substrate.

In an embodiment, in order to better enhance an anti-interference performance between sub-pixel areas, the present disclosure further includes a step of disposing a conducting post on a surface of a pixel definition layer of the array substrate. Before the evaporation of the present disclosure, a cylindrical structure is formed on the surface of the substrate to resist and support. In a structure of a phosphorescent material (a kind of luminous material) for evaporation, since a triplet excited state has a long life cycle, it is easy to diffuse a long distance in elements to make color impure, and the luminous efficiency is low, thereby affecting a lifetime. Adding this cylindrical structure ensures high light transmittance and does not affect display. In the evaporation process, an evaporation color mixing can be blocked. After assembly, it can block an excitatory diffusion and avoid affecting the lifetime.

In one embodiment, before the step S203 of the method shown in FIG. 2, the method further includes: supplying power to the conducting post disposed on the surface of the pixel definition layer of the array substrate to prevent deposition of the luminous material charged particles on the conducting post.

In one embodiment, the step of supplying power to the conducting post disposed on the surface of the pixel definition layer of the array substrate includes: electrically connecting the conducting post to a conductive terminal of the evaporation equipment, and supplying power to the conducting post by the conductive terminal of the evaporation equipment.

Figure 3:
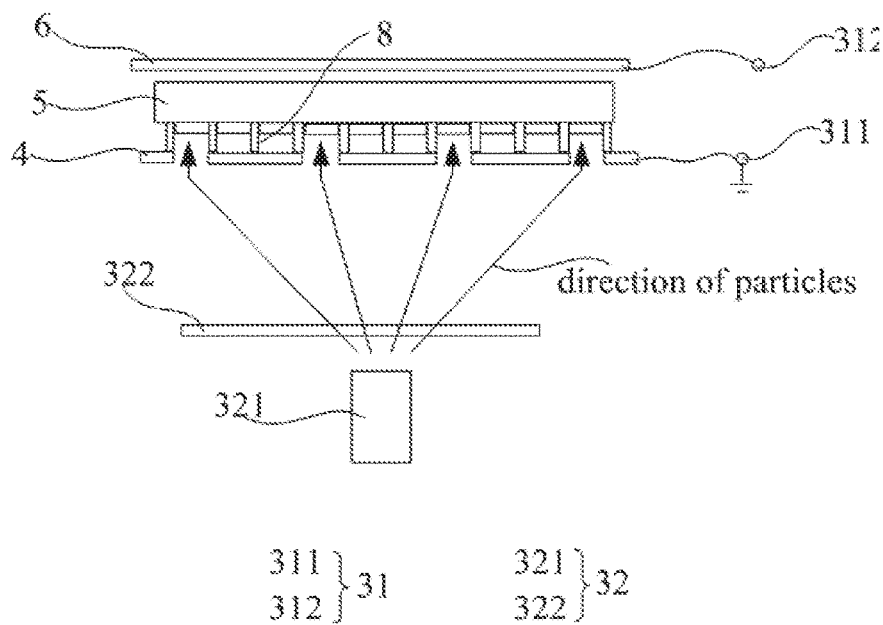
FIG. 3 is a schematic diagram of an evaporation equipment according to an embodiment of present disclosure.

In one embodiment, as shown in FIG. 3, an evaporation equipment for a luminous material provided by an embodiment of the present disclosure includes:

An alignment module (not shown in FIG. 3) is configured to align a mask 4 with an array substrate 5 in precise alignment, where the alignment module is generally a robot or the like.

An electric field module 31 is configured to generate an electric field covering the array substrate.

A charged ion module 32 is configured to process the luminous material to generate luminous material charged particles, where after the luminous material charged particles pass through the mask, they are deposited on a pixel area of the array substrate under the electric field.

In one embodiment, as shown in FIG. 3, the charged ion module 32 includes an evaporation source 321 and a charge source 322. The evaporation source 321 is used to control the luminous material evaporation source outputting luminous material particles, and the charge source 322 is used to control electric charges of the luminous material particles having a specific polarity.

In one embodiment, the charge source 322 includes a mesh charging structure. The luminous material particles will be charged after passing through the structure, to form the luminous material charged particles.

In one embodiment, the evaporation equipment for the luminous material further includes an electric-field electrode 6. The electric-field electrode 6 is parallel to the mask 4.

In one embodiment, as shown in FIG. 3, the electric field module 31 includes a ground terminal 311 and an electric field power terminal 312. The electric field power terminal 312 is used to output an electric field voltage. In operation, the mask 4 is grounded through the ground terminal 311, and the field electrode 6 acquires the electric field voltage through electric field power terminal 312. On this basis, the electric field is formed.

In one embodiment, the evaporation equipment further includes a first power supply module for supplying power to the circuit of the array substrate.

In one embodiment, the evaporation equipment further includes a second power supply module for supplying power to conducting posts disposed on the surface of the pixel definition layer of the array substrate.

Figure 4:
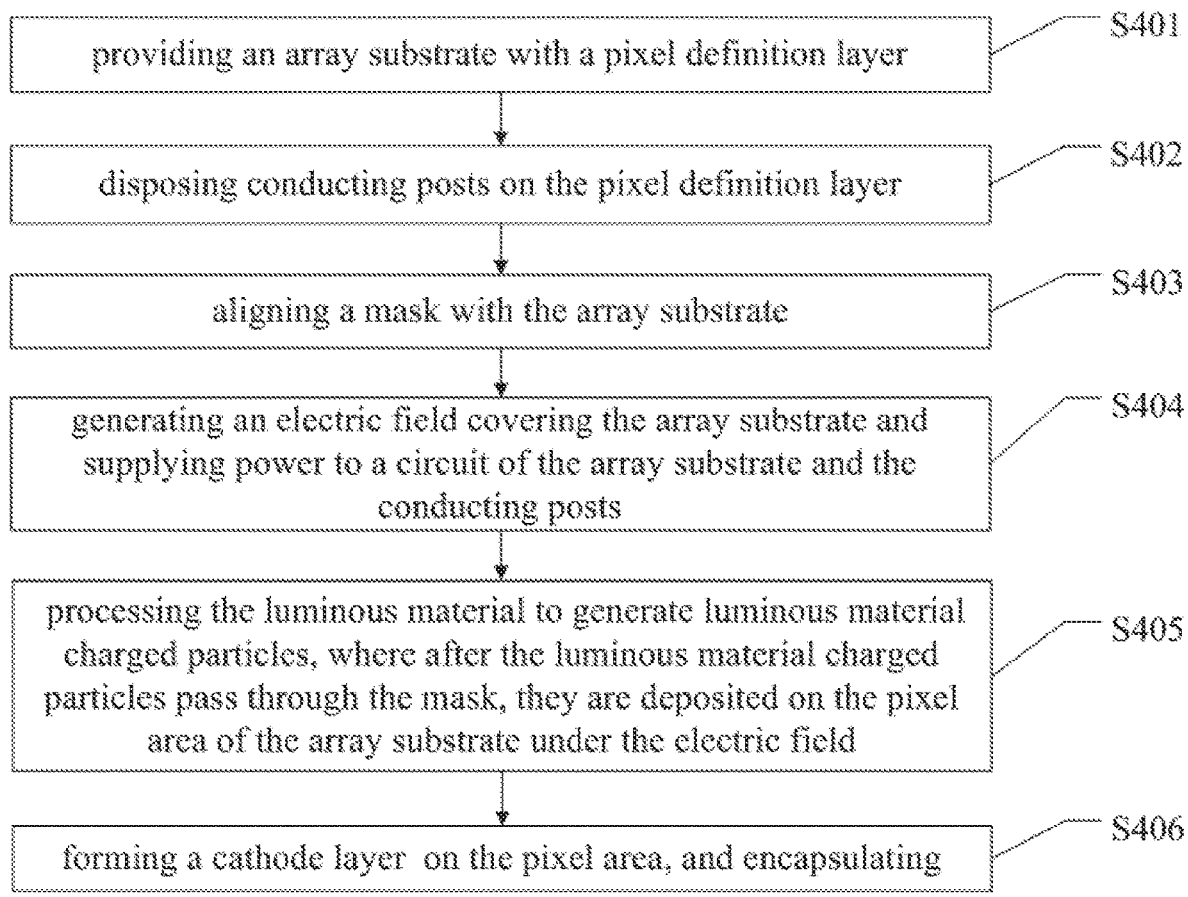
FIG. 4 is a second flowchart of an evaporation method according to an embodiment of present disclosure.

In one embodiment, as shown in FIG. 4, an evaporation method of a luminous material provided by an embodiment of the present disclosure includes the following steps.

In a step S401, an array substrate with a pixel definition layer is provided.

Figure 5:
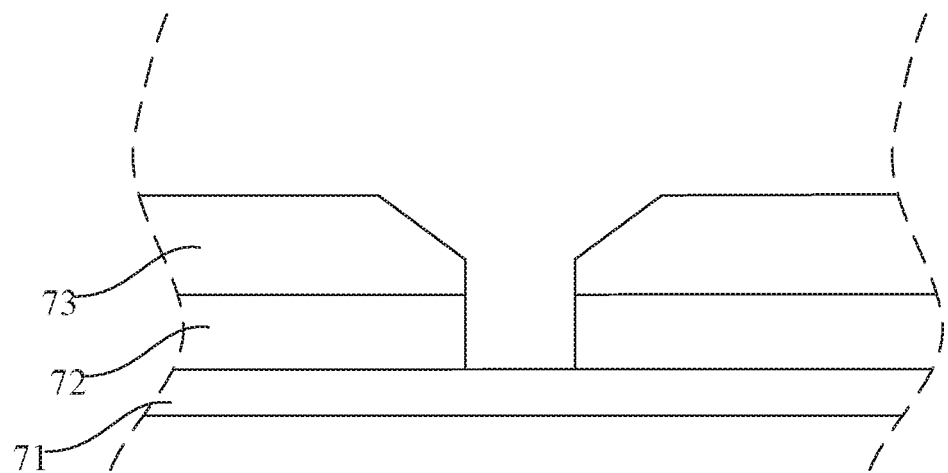
FIG. 5 is a first schematic diagram of a display panel according to an embodiment of present disclosure.

The array substrate is provided as shown in FIG. 5, and an area formed by the pixel definition layer is a pixel area.

Figure 6:
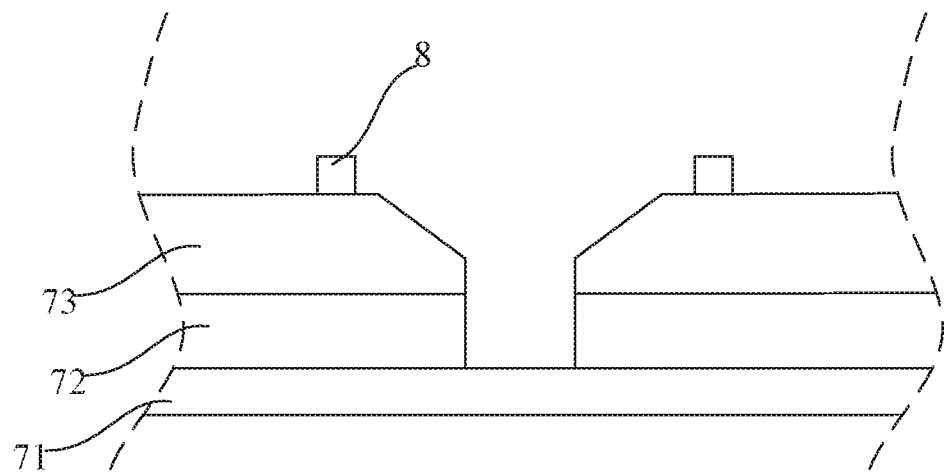
FIG. 6 is a second schematic diagram of a display panel according to an embodiment of present disclosure.

In a step S402, as shown in FIG. 6, conducting posts 8 are disposed on the pixel definition layer.

In one embodiment, the conducting posts may be continuously arranged to form a supporting wall.

In a step S403, an anode layer is formed on the pixel area.

In the step S403, a mask is aligned with the array substrate.

In a step S404, an electric field covering the array substrate is generated. Power is supplied to a circuit of the array substrate and the conducting posts.

The mask 4 is grounded through the ground terminal 321, and the electric-field electrode 6 acquires the electric field voltage through the electric field power terminal 322 to form the electric field.

In a step S405, the luminous material is processed to generate luminous material charged particles. After the luminous material charged particles pass through the mask, they are deposited on the pixel area of the array substrate under the electric field.

Figure 7:
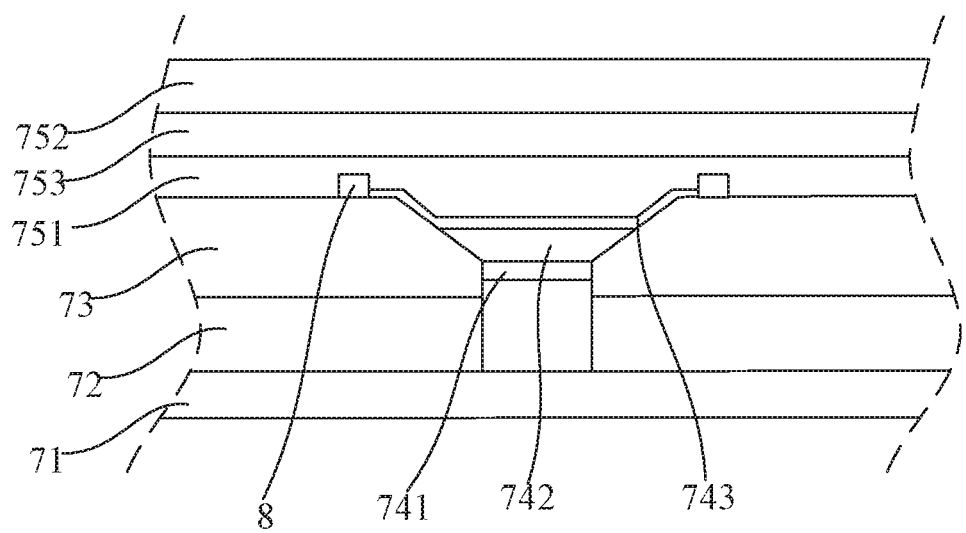
FIG. 7 is a third schematic diagram of a display panel according to an embodiment of present disclosure.

In a step S406, a cathode layer is formed on the pixel area, and it is encapsulated to obtain a display panel as shown in FIG. 7.

In an embodiment, as shown in FIG. 7, the display panel provided by an embodiment of the present disclosure includes an array substrate 71, a planarization layer 72 disposed on the array substrate 71, a pixel definition layer 73 disposed on the planarization layer 72, an OLED device 74 disposed in a defined area of the pixel definition layer 73 and in contact with the array substrate 71 through the planarization layer 72, and an encapsulation layer 75 covering the OLED device 74, the pixel definition layer 73, and the array substrate 71.

In one embodiment, the array substrate includes a substrate and a thin film transistor array disposed on the substrate, metal traces, and the like.

Generally, the planarization layer 72 is an organic layer and configured to planarize the array substrate 71.

Similarly, the pixel definition layer 73 is also made by using an organic material. It can be understood that the planarization layer 72 and the pixel definition layer 73 can be patterned in one mask process.

Figure 8:
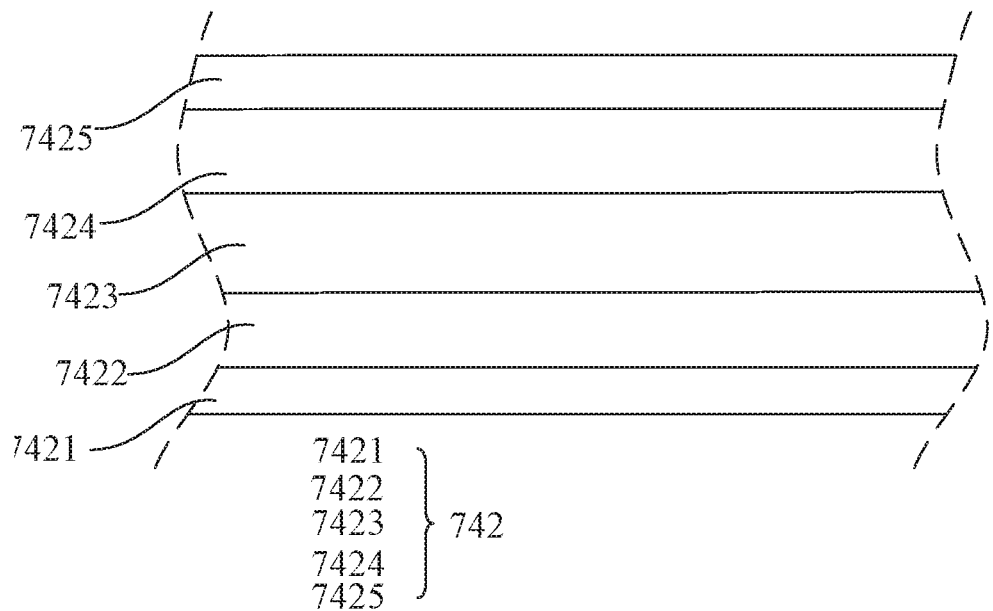
FIG. 8 is a fourth schematic diagram of a display panel according to an embodiment of present disclosure.

The defined area refers to an area vacated by the pixel definition layer 73 when the pixel definition layer 73 is formed, for forming an organic luminous material (a luminous layer) in the defined area in a subsequent process. The OLED device 74 is composed of an anode 741, an organic layer 742, and a cathode 743. As shown in FIG. 8, the organic layer 742 includes a hole injection layer 7421, a hole transport layer 7422, a luminous layer 7423, an electron transport layer 7424, and an electron injection layer. 7425. The luminous layer 7423 is formed by an evaporation method provided by the present disclosure.

In one embodiment, as shown in FIG. 7, the encapsulation layer 75 includes a first inorganic layer 751, a second inorganic layer 752, and an organic layer 753 disposed between the first inorganic layer 751 and the second inorganic layer 752.

In an embodiment, as shown in FIG. 7, the display panel further includes conducting posts 8 disposed on a surface of the pixel definition layer 73 of the array substrate.

In one embodiment, the conducting posts are continuously arranged to form a supporting wall.

According to the above embodiments, it can be known that:

The present disclosure provides a new evaporation technique for a luminous material, including aligning a mask with an array substrate; generating an electric field covering the array substrate; and processing the luminous material to generate luminous material charged particles, where after the luminous material charged particles pass through the mask, they are deposited on a pixel area of the array substrate under the electric field. By providing the electric field covering the array substrate and generating the luminous material charged particles, these luminous material charged particles will change a direction of motion under an action of the electric field after passing through the mask. The luminous material charged particles are vertically moved toward a pixel area of the array substrate along a direction of the electric field, and then uniformly deposited on the pixel area of the array substrate, and are not deposited in a pixel critical position along an original moving direction, nor deposited in other positions. A The uniformity of film formation of the luminous material is ensured, and the technical problem of a poor uniformity of film formation of the luminous material at the critical position of sub-pixels existing in the existing display panel is solved, and a color shift or color mixing problem at the critical position of the sub-pixels is also solved.

In conclusion, although the present disclosure has been described with reference to the preferred embodiments thereof, it is apparent to those skilled in the art that a variety of modifications and changes may be made without departing from the scope of the present disclosure which is intended to be defined by the appended claims.

What is claimed is:

1. An evaporation method for a luminous material, comprising:
   aligning a mask with an array substrate;
   disposing a conducting post on a surface of a pixel definition layer of the array substrate;
   supplying power to the conducting post disposed on the surface of the pixel definition layer of the array substrate;
   generating an electric field covering the array substrate; and
   processing the luminous material to generate luminous material charged particles, wherein after the luminous material charged particles pass through the mask, they are deposited on a pixel area of the array substrate under the electric field,
   wherein in the step of supplying power to the conducting post disposed on the surface of the pixel definition layer of the array substrate, the method comprises: electrically connecting the conducting post to a conductive terminal of an evaporation equipment, and supplying power to the conducting post by the conductive terminal of the evaporation equipment.

2. The evaporation method for the luminous material as claimed in claim 1, wherein in the step of generating the electric field covering the array substrate, the method comprises:
   grounding the mask; and
   supplying power to an electric-field electrode, wherein the electric-field electrode is parallel to the mask, and the array substrate is located between the electric-field electrode and the mask.

3. The evaporation method for the luminous material as claimed in claim 1, wherein in the step of generating the luminous material charged particles, the method comprises:
   outputting luminous material particles by a luminous material evaporation source; and
   controlling electric charges of the luminous material particles having a specific polarity.

4. The evaporation method for the luminous material as claimed in claim 1, further comprising: supplying power to a circuit of the array substrate.

5. The evaporation method for the luminous material as claimed in claim 4, wherein in the step of supplying power to the circuit of the array substrate, the method comprises:
   supplying power to the circuit of the array substrate by a thin film transistor circuit of the array substrate.

6. A display panel, comprising: an array substrate, a pixel definition layer disposed on the array substrate, and a luminous material layer in a pixel area defined by the pixel definition layer, wherein the luminous material layer is formed by the evaporation method of the luminous material according to claim 1.

7. The display panel as claimed in claim 6, further comprising a plurality of conducting posts disposed on a surface of the pixel definition layer of the array substrate.

8. The display panel as claimed in claim 7, wherein the plurality of conducting posts are continuously arranged to form a supporting wall.

9. The display panel as claimed in claim 6, further comprising an encapsulation layer disposed on the pixel definition layer and the luminous material layer.

10. The display panel as claimed in claim 9, wherein the encapsulation layer comprises a first inorganic layer, a second inorganic layer, and an organic layer disposed between the first inorganic layer and the second inorganic layer.

11. An evaporation equipment for a luminous material, comprising:
    an alignment module configured to align a mask with an array substrate;
    an electric field module configured to generate an electric field covering the array substrate;
    a charged ion module configured to process the luminous material to generate luminous material charged particles, wherein after the luminous material charged particles pass through the mask, they are deposited on a pixel area of the array substrate under the electric field; and
    a second power supply module configured to supply power to a conducting post disposed on a surface of a pixel definition layer of the array substrate, wherein the conducting post is electrically connected to a conductive terminal of the evaporation equipment, and power is supplied to the conducting post by the conductive terminal of the evaporation equipment.

12. The evaporation equipment for the luminous material as claimed in claim 11, further comprising an electric-field electrode, wherein the electric-field electrode is parallel to the mask.

13. The evaporation equipment for the luminous material as claimed in claim 11, further comprising a first power supply module configured to supply power to a circuit of the array substrate.

14. The evaporation equipment for the luminous material as claimed in claim 11, wherein the charged ion module comprises an evaporation source and a charge source, and the evaporation source is configured to control a luminous material evaporation source to output luminous material particles, and the charge source is configured to control electric charges of the luminous material particles having a specific polarity.

15. The evaporation equipment for the luminous material as claimed in claim 14, wherein the charge source comprises a mesh charging structure.

16. The evaporation equipment for the luminous material as claimed in claim 11, wherein the electric field module comprises a ground terminal and an electric field power terminal, and the electric field power terminal is configured to output an electric field voltage, and in operation, the mask is grounded through the ground terminal, and the electric-field electrode obtains an electric field voltage through the electric field power terminal to form the electric field.

* * * * *